United States Patent
Tolouei Asbforoushani et al.

(10) Patent No.: US 10,948,223 B2
(45) Date of Patent: Mar. 16, 2021

(54) EVAPORATIVE FLUID-COOLER WITH INTEGRATED MECHANICAL COOLING SYSTEM

(71) Applicants: Maryam Tolouei Asbforoushani, Portland, OR (US); Raghuveer H Vaddarse Subbarama, Pleasanton, CA (US)

(72) Inventors: Maryam Tolouei Asbforoushani, Portland, OR (US); Raghuveer H Vaddarse Subbarama, Pleasanton, CA (US)

( * ) Notice: Subject to any disclaimer, the term of this patent is extended or adjusted under 35 U.S.C. 154(b) by 41 days.

(21) Appl. No.: 15/665,764

(22) Filed: Aug. 1, 2017

(65) Prior Publication Data

US 2020/0284480 A1 Sep. 10, 2020

(51) Int. Cl.
*F25B 25/00* (2006.01)
*F25B 39/04* (2006.01)
(Continued)

(52) U.S. Cl.
CPC .......... *F25B 25/005* (2013.01); *F25B 39/022* (2013.01); *F25B 39/04* (2013.01);
(Continued)

(58) Field of Classification Search
CPC ...... F24F 5/0035; F24F 1/0007; F24F 1/0087; F24F 1/0011; Y02B 30/545; F25B 25/005;
(Continued)

(56) References Cited

U.S. PATENT DOCUMENTS

| 4,361,525 A | * | 11/1982 | Leyland | F24F 6/04 165/60 |
| 4,827,733 A | * | 5/1989 | Dinh | F24F 6/02 62/305 |

(Continued)

*Primary Examiner* — Frantz F Jules
*Assistant Examiner* — Lionel Nouketcha
(74) *Attorney, Agent, or Firm* — Steven A. Nielsen; www.NielsenPatents.com

(57) ABSTRACT

A mission critical facility is an enclosed space whose failure can bring a significant loss to a business. An example of a mission critical facility is a data center which usually comprises computers, servers, storage equipment, networking equipment, telecom equipment and associated electrical components working 24/7. The electrical components in the data center produce a lot of heat that requires removal from the enclosed space by using an air conditioning system. This invention includes a fluid cooling apparatus that cools the enclosed space using optimum power and water consumptions. The enclosed space can be a mission critical facility including but not limited to a data center. The disclosed fluid cooling apparatus offers low power and water consumption by combining a mechanical cooling system with an evaporative fluid cooling system in one single apparatus. Some embodiments locate the condenser coil for the mechanical cooling system in the evaporative fluid cooling's exhaust air to save on space and power consumption, which is novel in the industry. Also, this invention proposes using pre-cooling techniques for fluid-coolers which further improves the efficiency of the fluid cooling system which is also novel in the industry. The disclosed fluid cooling apparatus has three modes of operation to optimize power and water consumptions. Also, the disclosed fluid cooling apparatus can be used to deliver cold air to the enclosed space, cold fluid to the enclosed space or an end user or a combination of both which is called hybrid-cooling.

15 Claims, 9 Drawing Sheets

(51) Int. Cl.
*F25B 39/02* (2006.01)
*F25B 7/00* (2006.01)
*F25B 6/02* (2006.01)

(52) U.S. Cl.
CPC . *F25B 6/02* (2013.01); *F25B 7/00* (2013.01); *F25B 2500/18* (2013.01)

(58) Field of Classification Search
CPC .... F25B 39/04; F25B 39/022; F25B 2500/18; F25B 6/02; F25B 7/00
See application file for complete search history.

(56) References Cited

U.S. PATENT DOCUMENTS 6,976,524 B2 * 12/2005 Walsh ...................... F24F 3/06
165/63
2018/0135880 A1 * 5/2018 Ghadiri Moghaddam ..................
F24F 11/83

\* cited by examiner

EVAPORATIVE FLUID-COOLER WITH INTEGRATED MECHANICAL COOLING SYSTEM

COPYRIGHT AND TRADEMARK NOTICE

This application includes material which is subject or may be subject to copyright and/or trademark protection. The copyright and trademark owner(s) has no objection to the facsimile reproduction by any of the patent disclosure, as it appears in the Patent and Trademark Office files or records, but otherwise reserves all copyright and trademark rights whatsoever.

BACKGROUND OF THE INVENTION

(1) Field of the Invention

The invention generally relates to a means and method to use evaporative fluid cooling with integrated mechanical cooling.

A mission critical facility is an enclosed space whose failure can bring a significant loss to a business. An example of a mission critical facility is a data center, telephone exchange, telecom room, networking center, business exchange which house computers and telecom equipment. A data center usually comprises computers, servers, storage equipment, networking equipment, telecom equipment and associated electrical components working 24/7. The electrical components in the data center produce a lot of heat that requires removal from the enclosed space by using an air conditioning system. The air-conditioning system often consumes more than 40% of the total consumed energy in the data center. There are different techniques to cool a data center including but not limited to:

(1) A data center's air cooling system where a cooling apparatus is installed inside or outside of the enclosed space to provide cold air to the enclosed space. The cooling apparatus that is installed outside of the enclosed space can be a direct outdoor air system, which conditions the outdoor air and delivers it to the enclosed space, or a recirculating air system that conditions the return air from the enclosed space and delivers it to the enclosed space with no or minimal introduction of outdoor air to the enclosed space. Alternatively, the cooling apparatus can be installed inside the enclosed space to provide cold air to the enclosed space. In this case the cooling apparatus is closer to the heat source (e.g. the electrical components) inside the enclosed space which makes the heat removal process more efficient.

(2) A data center's liquid cooling system where a liquid cooling apparatus is installed outside of the enclosed space and provides a cold fluid to another heat removal apparatus or directly to the heat source (e.g. the electrical components) to remove the heat from the enclosed space. This embodiment of the heat removal apparatus can comprise a rear door heat exchanger, a cooling distribution unit, a fan coil wall, and a cold plate or liquid bath for direct liquid cooling purposes. A data center using a liquid cooling system is usually more efficient than a data center using an air cooling system since it is using liquid as the cooling media instead of air which has a much higher thermal capacity than air. Also, moving liquid inside an enclosed space is much more efficient than moving air (i.e. a pumping power vs. a fan power). A data center's liquid cooling system can be used for high density cooling which allows for more IT density in a single IT rack.

(3) Any combination of air cooling and liquid cooling systems is usually called a hybrid cooling system in the mission critical cooling industry.

This invention includes a fluid cooling apparatus that cools the enclosed space using optimum power and water consumptions. The disclosed embodiments offer a cost-effective liquid cooling solution that has optimum power consumption by offering different modes of operation. Also, the proposed fluid cooling apparatus addresses one of the new and main concerns in the cooling industry which is water usage for cooling purpose. Water is a limited resource, and the invention significantly optimizes water consumption used for cooling the enclosed space. The disclosed fluid cooling apparatus offers low power and water consumption by combining a mechanical cooling system with an evaporative fluid cooling system in one single apparatus. Some embodiments locate the condenser coil for the mechanical cooling system in the evaporative fluid cooling's exhaust air to save on space and power consumption, which is novel in the industry. Also, this invention proposes using pre-cooling techniques for fluid-coolers which further improves the efficiency of the fluid cooling system. Using the disclosed layout, the pre-cooler for fluid coolers is also novel.

FLUID CIRCUITS

Figure 1:
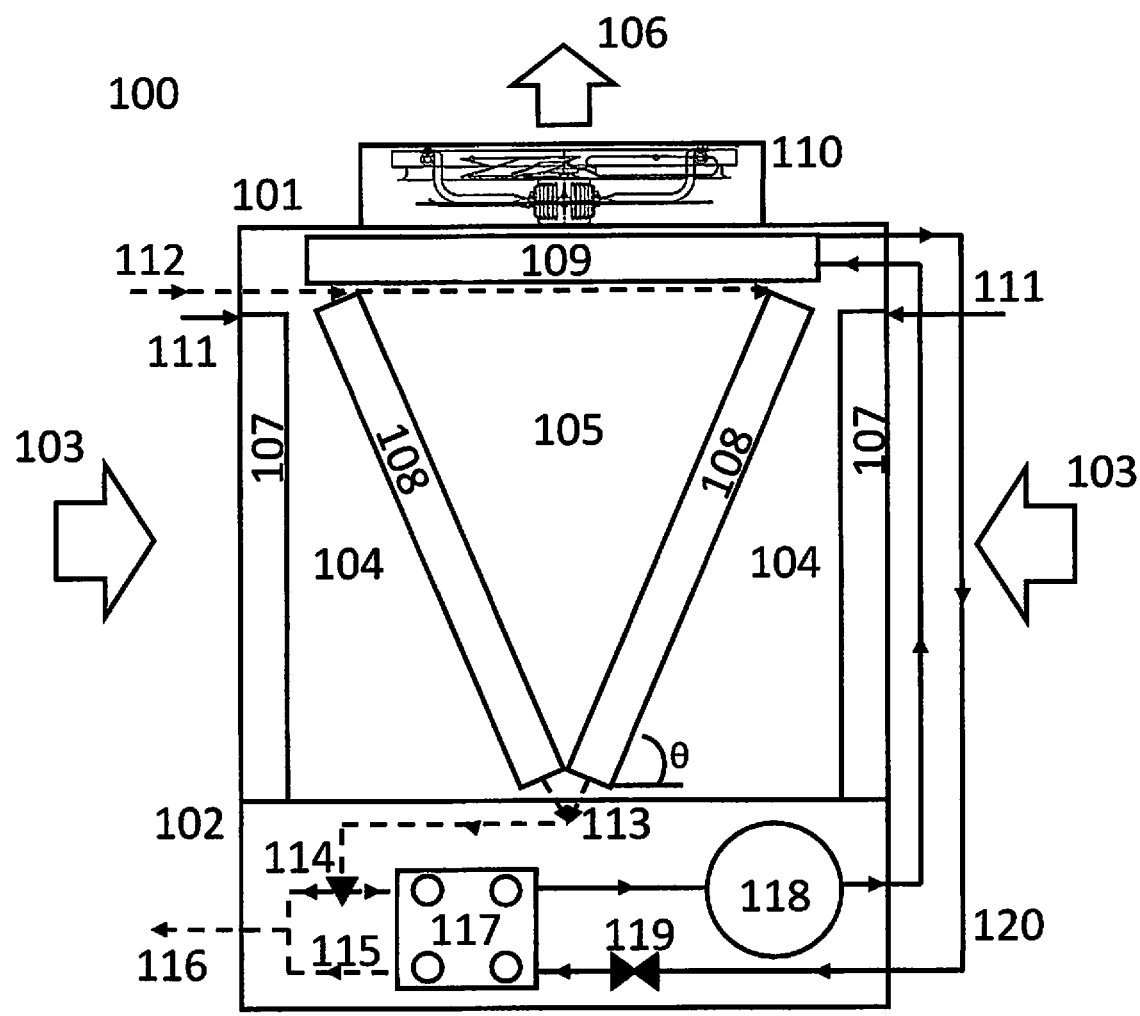
FIG. 1 illustrates the components of an evaporative fluid-cooler with an integrated mechanical cooling system using an evaporative cooling media.

This system has two main fluid circuits:

1. A refrigerant circuit which is a closed circuit within the evaporative fluid-cooler. The refrigerant is not in contact with an end user (e.g. the electrical components). The main components of the refrigerant circuit are presented in the following sections. In the refrigerant circuit, an evaporator is a liquid-to-refrigerant heat exchanger (LRHX) and a condenser is a coil which is placed upstream of exhaust fans. An exhaust air after the main cooling coil (point 3 in FIG. 1) still has great potential for cooling compared to outdoor air (OA) in extreme conditions and its' temperature is between OA dry-bulb (DB) and OA wet-bulb (WB) temperatures. Entering air conditions for the condenser coil can improve the refrigerant circuit performance and expand the application of Turbocor compressors with this apparatus in almost all locations.

2. A process fluid circuit where a process fluid is recirculating between the proposed fluid cooler and the end user in a closed loop to reject the heat from the end user. Operation of the process fluid in the closed loop protects the process fluid from any contamination and exposure to any other media.

Fluid cooler main components: The invention described and claimed herein may comprise the following components:

Main components in the refrigerant circuit are:

Expansion valve: as a regular component for the mechanical cooling. The mechanical cooling system, which can be a direct expansion (DX) system, is a cooling system which includes compressors (or refrigerant pumps in some applications), refrigerant, evaporator, condenser and expansion valve as the main components.

Compressor: One or more compressors can be used in the proposed mechanical system. Compressors can be Turbocor compressors or digital scroll compressors or any other common types of compressor in the market. Turbocor compressor is an oil free compressor which has both high full load and partial load efficiencies. Turbocor compressor has low sound level and is very compact.

Refrigerant: Refrigerant can be any common refrigerant in the market including but not limited to R134a. R134a refrigerant is from the HFC family and is very environment friendly with zero Ozone depletion level and global warming potential (GWP) of 1200 which is one of the lowest among refrigerants. Turbocor compressors use R134a as the refrigerant.

Liquid-to-refrigerant heat exchanger (LRHX): This can be a premium shell and tube heat exchanger or any other types of flat-plate liquid-to-liquid exchanger compatible with refrigerants. This exchanger acts as the evaporator for the mechanical cooling system. The proposed fluid cooler can have multiple LRHXs.

Condenser coil: this is a coil or coils to reject heat from the refrigerant to the air. It can be a Copper-Aluminum coil or a microchannel coil or any other high performance coil. The condenser coil can have a corrosion resistant coating which improves the corrosion resistance properties of the coil.

Main components in the process fluid circuit are:

3-way valve: it is in the process fluid circuit to direct the process fluid to the end user (e.g. the electrical components in the data center) or the LRHX for further cooling using the mechanical cooling system.

Exhaust air (EA) fans: these are the exhaust air (EA) fans for the air movement through the fluid-cooler. The number of required EA fans varies and depends on the size (or capacity) of the proposed fluid-cooler. EA fans can be premium electronically commutated motors (ECM) axial fans which are compact, light and efficient. The air flow configuration can be blow through or draw through in the proposed fluid-cooler.

Evaporative cooling media: or evaporative cooler to pre-cool the outdoor air (OA) before entering the main cooling coils when the evaporative media is operating using a water evaporation mechanism. When the OA passes through the evaporative media, the water will evaporate and cool the outdoor air close to its wet-bulb temperature. It can be a direct feed evaporative system which is connected to a tap water supply and there is no water recirculation pump/loop, or it can be a direct evaporative cooling (DEC) system with a pumping and drain system. The thickness of the evaporative media varies and depends on the required performance. The evaporative media could have up to 85% evaporative performance. Usually the evaporative cooling system includes the evaporative media, a water feed line, and a water collection pan and drain (not shown in FIG. 1).

Main cooling coils: which are usually Copper-Aluminum cooling coils to cool the process fluid which comes from the end user (e.g. the electrical components in the data center). This cooling coil is a liquid-to-air heat exchanger which allows heat transfer between the process fluid passing through the coil and air flow over the coil. These coils can be epoxy coated for corrosion resistance properties. The main cooling coils are preferably on both sides of the fluid-cooler and can have 80% to 90% sensible effectiveness depending on the installation, available area and air face velocity over the cooling coils. The main cooling coils can be installed with an angle respect to the horizon (see FIG. 1 and the angle $\theta$ in FIG. 1) which can be equal or smaller than 90 degrees. In case of using 90 degrees angle, the cooling coils are preferably installed vertically.

Process fluid: This is the main fluid which is recirculating in the closed loop between the fluid cooler and the end user. This can be any type of fluid including but not limited to water, Glycol, mixture of water and Glycol, Refrigerant (for the refrigerant pump system) or any non-conductive fluid for the purpose of direct liquid cooling.

Unit installation: The proposed fluid cooler is an outdoor unit which needs access to outdoor air. For service and maintenance purposes the unit can be installed in an enclosed space with proper access to the outdoor air for ease of maintenance.

Operating Modes

Dry-economizer: It is usually happening in winter when the outdoor air is cold and there is no need to run the evaporative cooler or compressors. In this mode the cold air passes through the main cooling coil and rejects the heat from the process fluid. The process fluid directly goes to the end user and bypasses the LRHX using the 3-way valve. In this mode, the EA fans modulate to optimize the power consumption of the fluid cooler. There is no water consumption in this mode.

Wet-economizer: This mode may be used when the outdoor air is not cold enough to run the unit under dry-economizer. In this case, the evaporative cooler starts to operate to pre-cool the outdoor air before entering the main cooling coil. The evaporative cooler cools the outdoor air by evaporating water and reduces the outdoor air-dry bulb (DB) temperature. The cooled air enters the main cooling coils to reject the head from the process fluid. In this mode, the compressor is OFF and the process fluid bypasses the LRHX. Also, in this mode the EA fans modulate to optimize the power and water consumption of the fluid cooler.

Wet—economizer with assisted DX: This mode happens in warm weather or extreme outdoor air conditions when the fluid cooler cannot cover the target cooling load only by operating under the economizer modes which usually means that the unit cannot deliver the process fluid's target supply temperature. In this case, the EA fans are running at 100% of their speed and the evaporative cooler is running to maximize the economizer performance. The return process fluid first passes through the main cooling coils to reject part of its heat. Then the process fluid passes through the LRHX, while the 3-way valve is open to direct the process fluid into the LRHX. The compressors are running and the refrigerant rejects the rest of the heat from the process fluid before the process fluid leaves the LRHX. The required capacity and size of the compressors depend on the location, peak outdoor air conditionings and desired supply process fluid temperature. To optimize the compressors' power consumption in this mode, the compressors also modulate based on the required capacity from the mechanical cooling to meet the process fluid's supply temperature.

Applications of the Proposed Fluid-Cooling System

The proposed fluid-cooler can be used to provide cool/warm process fluid to any enclosed space for cooling purposes including but not limited to mission critical facilities and data centers.

Figure 2:
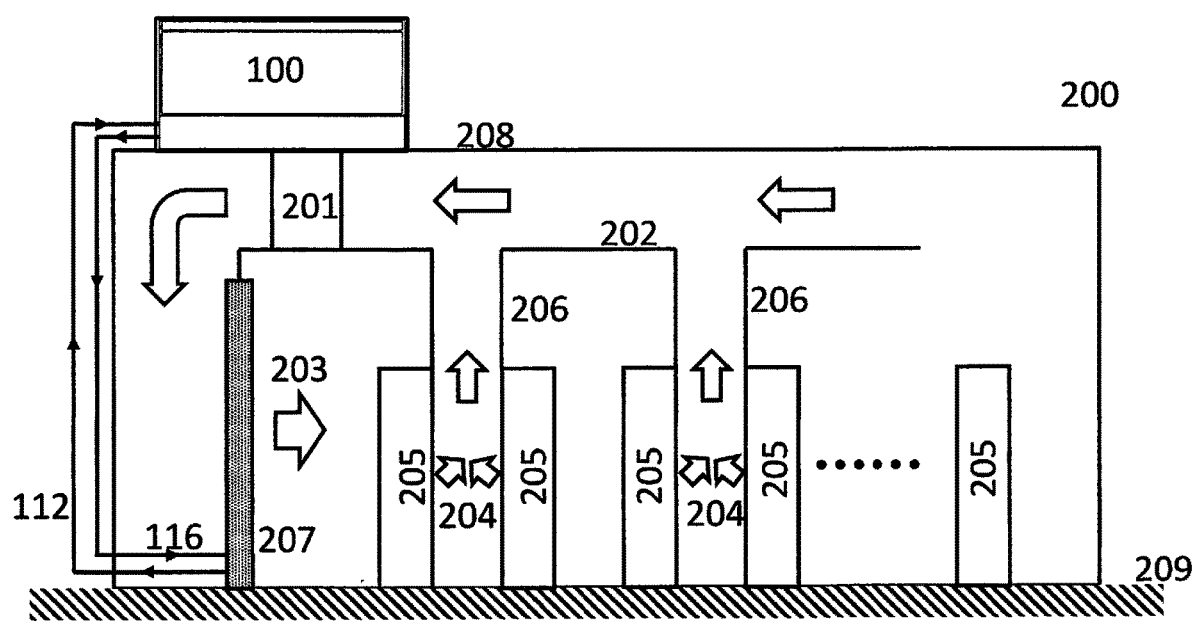
FIG. 2 illustrates an example of the application of the proposed evaporative fluid-cooler for an air-cooling purpose.

This system can provide process fluid to any other apparatus inside or outside of the enclosed space for the air-cooling purpose (see FIG. 2). Air cooled devices which can be used for this purpose are including but not limited to:
1. Computer room air handling (CRAH) unit which seats inside the enclosed space and provides cold air to the enclosed space. CRAH can be a 100% air-recirculation system which minimizes the need to introduce outdoor air to the enclosed space. This minimizes filtration and humidity control requirements for the enclosed space resulting in less power consumption.
2. Hot aisle containment cooler (HACC) unit which seats on top of a hot aisle or a cold aisle to reject the heat from the hot return air from the end user. This unit has application for high density cooling and cooling close to source. HACC is also a 100% air-recirculation system.
3. Fan coil wall (FCW)/or a coil wall and fans which seat inside the space to reject the heat from the hot return air from the enclosed space in a 100% air-recirculation system.
4. Any outdoor air handling (AHU) unit which is installed outside of the enclosed space and relies on the process fluid to provide cold supply air to the enclosed space.

Figure 3:
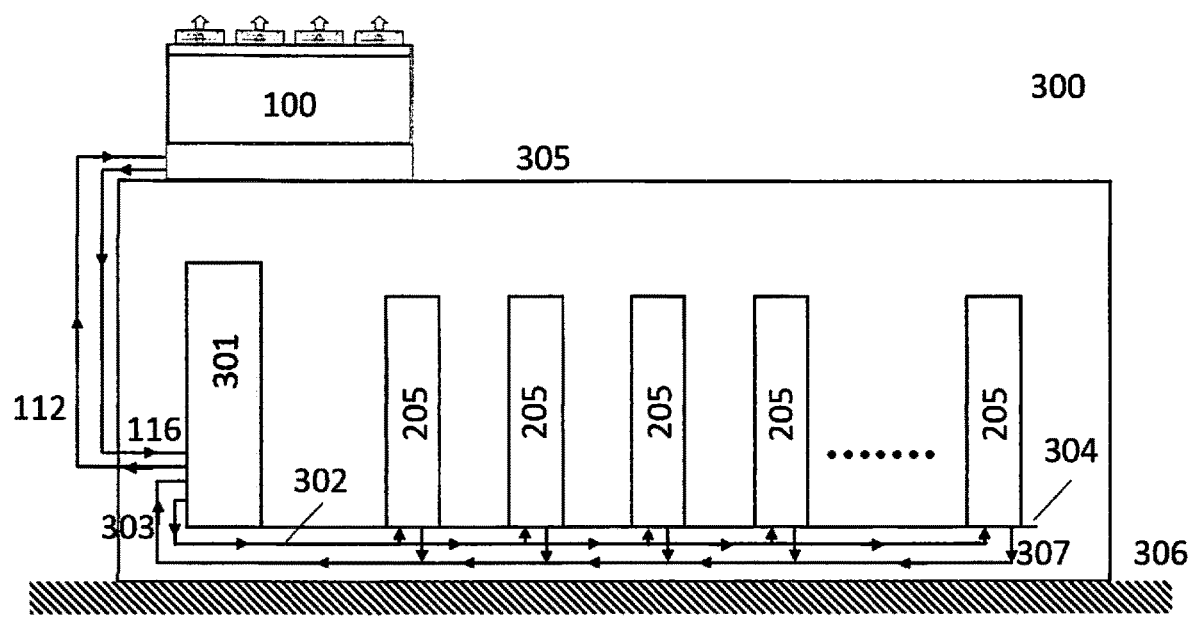
FIG. 3 shows an example of a data center that uses an evaporative fluid-cooler as the main cooling source and utilizes an evaporative fluid-cooler as part of the high-density cooling technology.

This system can provide process fluid to any other apparatus inside or outside of the enclosed space for liquid-cooling or high-density cooling purposes (see FIG. 3). Liquid cooling devices which can be used this purpose are including but not limited to:
  i. Cold plates for direct contact liquid cooling (DCLC) in high performance computing (HPC) marked which are installed directly on the electrical components.
  ii. The cooling distribution unit (CDU) and the rear door heat exchanger (RDHx) which have application in high density cooling.
  iii. Direct immersion cooling systems for direct contact liquid cooling where the electrical components are immersed in a bath of a non-conductive fluid.

This system can provide process fluid to any combination of devices inside or outside of the enclosed space for the hybrid cooling purposes. This means that the process fluid is used in the air cooling device and the liquid cooling device simultaneously in the same enclosed space.

DETAILED DESCRIPTION OF THE DRAWINGS

FIG. 1 shows the novel evaporative fluid-cooler with assisted mechanical cooling 100 which has two main sections: top section 101 where the outdoor air 103 enters the fluid-cooler 100 (also called the unit), and bottom section 102 where the mechanical cooling equipment is located. In top section 101 the outdoor air 103 enters the unit from both sides and it first passes through the evaporative cooling pads (also known as the evaporative media) 107. In warm weather operation, the evaporative cooling pads 107 cool the outdoor air 103 close to its wet bulb temperature using tap water 111. The dry bulb temperature of air 104 after the evaporative cooling pads 107 depends on the efficiency of the evaporative cooling pads 107. Tap water 111 does not need any sort of water treatments almost in all the geographic locations.

There is a drain pan and drain valve at the bottom of the evaporative cooling pads 107 to drain the excess water of 111 from the unit which are not shown in FIG. 1. The cold air 104 after the evaporative cooling pads 107 passes over the main cooling coil/coils 108. The hot return process fluid 112 returning from the enclosed space enters the main cooling coils 108. The cold air 104 picks up the heat from the hot return fluid 112 which passes through the main cooling coils 108 and hot air 105 leaves the main cooling coils 108. The hot air 105 still has potential for heat rejection and usually has lower dry bulb temperature than the outdoor air 103 in warm weather conditions. The hot air 105 then enters the condensing coil/coils 109 where it picks up the heat from the refrigerant 120 which passes through the condenser coils 109. Finally, the exhaust fans 110 exhaust the hot air 106 to the atmosphere. Those who are expert in the art understand that the exhaust fans 110 can be used in draw through or blow through configurations respect to the condenser coils 109. Also, both evaporative cooling pads 107 and main cooling coils 108 can be installed with the angle of θ respect to horizon where θ=90° means that the evaporative cooling pads 107 and the main cooling coils 108 are installed vertically respect to horizon.

The hot return fluid 112 loses heat while passing through the main cooling coils 108 and becomes colder at point 113. In winter operation mode when the unit is running under dry economizer mode or in spring when the unit is running under the wet economizer mode, the three-way valve 114 directs the process fluid 113 to the enclosed space/end user since the fluid temperature at 113 is at the process fluid's target supply temperature required by the end user for the process fluid at point 116. In hot and extreme weather operating conditions when the fluid temperature at point 113 is still higher than the process fluid's target supply temperature, the three-way valve 114 directs the process fluid 113 to the liquid-to-refrigerant heat exchanger (LRHX) 117 where the refrigerant 120 picks up the heat from the process fluid 113 and the process fluid leaves the LRHX 117 at the condition of point 115. The process fluid 115 is at the process fluid's target supply temperature and it is supplied to the enclosed space/end user. The LRHX 117 can be a premium shell and tube heat exchanger or any other type of flat-plate liquid-to-liquid exchangers compatible with the refrigerant 120.

The hot refrigerant 120 leaves the LRHX 117 in low pressure vapor phase and passes through the compressor/compressors 118 where the pressure of the refrigerant 120 increases. Compressors 118 can be Turbocor compressors or digital scroll compressors or any other common compressors in the market. Then the refrigerant 120 passes through the condenser coils 109 where it becomes cool and changes phase to liquid at high pressure. The high-pressure liquid refrigerant 120 passes through the expansion valve 119 before entering the LRHX 117. The expansion valve 119 adjusts the pressure of the refrigerant 120 to lower pressure before entering LRHX 117. Those who are expert in the art realize that this unit can have more than one compressor 118, expansion valve 119, LRHX 117 and condenser coil 109 depending on the size of the unit and required mechanical cooling capacity as per design. The bottom section 102 can be moved to the side of the section 101 or any other place based on the design of the evaporative fluid cooler 100 to make it more compact and suitable for shipping and transportation. The process fluid 112 can be any type of fluid including but not limited to water, Glycol, mixture of water and Glycol, refrigerant (for the refrigerant pump system) or any non-conductive fluid for the direct liquid cooling as shown in FIG. 3.

The claimed invention offers optimum power and water consumptions in a single apparatus in comparison with existing fluid-coolers in the market by combining both the mechanical cooling system (the section 102) and free-cooling system (the section 101) in one single apparatus and locating the condenser coils 109 after the main cooling coils 108 which is disclosed for the first time herein. Also, the cooling coils 108 and the exhaust fans 110 are designed to maximize the dry economizer mode of the proposed apparatus and minimize water consumption in the apparatus.

FIG. 2 shows an example of a data center 200 that uses the novel evaporative fluid-cooler 100, which is disclosed herein, as the main cooling source. The data Center 200 can have multiple evaporative fluid-coolers 100 installed at the roof 208 or in the parking lot 209 beside the data center 200 depending on the required cooling capacity for the data center 200. In this configuration, the evaporative fluid-cooler 100 is used to sensibly and indirectly cool the data center's 200 air. This means there is no outdoor air introduced to the data center 200 as part of the main cooling strategy, and there is no humidity added or removed from the air inside the data center 200 as part of the main cooling strategy.

The data center 200 hosts IT racks 205 which are using electricity to process data 24/7/365 and produce heat which needs to be removed from inside the data center 200. To have a more efficient data center, data center owners can utilize hot aisle enclosures 206 to isolate hot leaving air 204 from the IT rack 206 from the cold entering air 203. The hot leaving air 204 is collected from all the hot aisle enclosures 206 in the data center 200 and is directed to the hot aisle return air plenum 202. Fans 201 move the air within the data center 200. Fans 201 draw the hot air 204 from the IT racks 205 and blow the air to the cooling coils 207. Cooling coils 207 sensibly cool the air and the cold air 203 leaves the cooling coils 207. The cold air 203 is supplied to IT racks 205. The process fluid 116 picks up the heat from the hot air 204 in the cooling coils 207. The hot return process fluid 112 leaves the cooling coils 207 and flows to the evaporative fluid-cooler 100 where it becomes cold to the process fluid's target supply temperature defined by the end user.

FIG. 3 shows an example of a data center 300 that uses the novel evaporative fluid-cooler 100 as the main cooling source and utilizes the fluid-cooler 100 as part of the high-density cooling system. The data Center 300 can have multiple evaporative fluid-cooler 100 installed at the roof 305 or in the parking lot 306 beside the data center 300. In this configuration, the evaporative fluid-cooler 100 is used to sensibly and indirectly cool the data center 300 in a high-density cooling configuration where fluid 302 is used to pick up the heat from the IT racks 205. This means that there is no air cooling system used as the main cooling source for the data center 300.

The data center 300 hosts the IT racks 205 which need to be cooled and are installed on a raised floor 304. The raised floor 304 can be used to run a piping 307 for delivering the cold fluid 302 to the IT racks 205 for fluid cooling purpose and collect the hot return fluid 303 from the IT racks 205. Those who are expert in the art understand that the piping 307 can be done in an overhead configuration on top of the IT racks 205 instead of using the raised floor 304. In this configuration, a cooling distribution unit (CDU) 301 is used to reject the heat from the hot fluid 302 to the cold process fluid 116 which is coming from the evaporative fluid-cooler 100. The advantage of using the cooling distribution unit 301 is to isolate the fluid 302 which is running inside the data center 300 from the process fluid 116 to avoid any contamination and have precise control on the fluid 302 inside the data center 300. In the cooling distribution unit 301, the cold process fluid 116 sensibly and indirectly picks up the heat from the hot fluid 303. The hot process fluid 112 leaves the CDU 301 and flows to the fluid-cooler 100 to become cold. Those who are expert in the art realize that the process fluid 116 can be used instead of the fluid 302 to reject the heat from the IT racks 205 and avoid using the cooling distribution unit 301. Using the process fluid 116 directly to cool the IT racks 205 increases the efficiency of the liquid cooling system.

Figure 4:
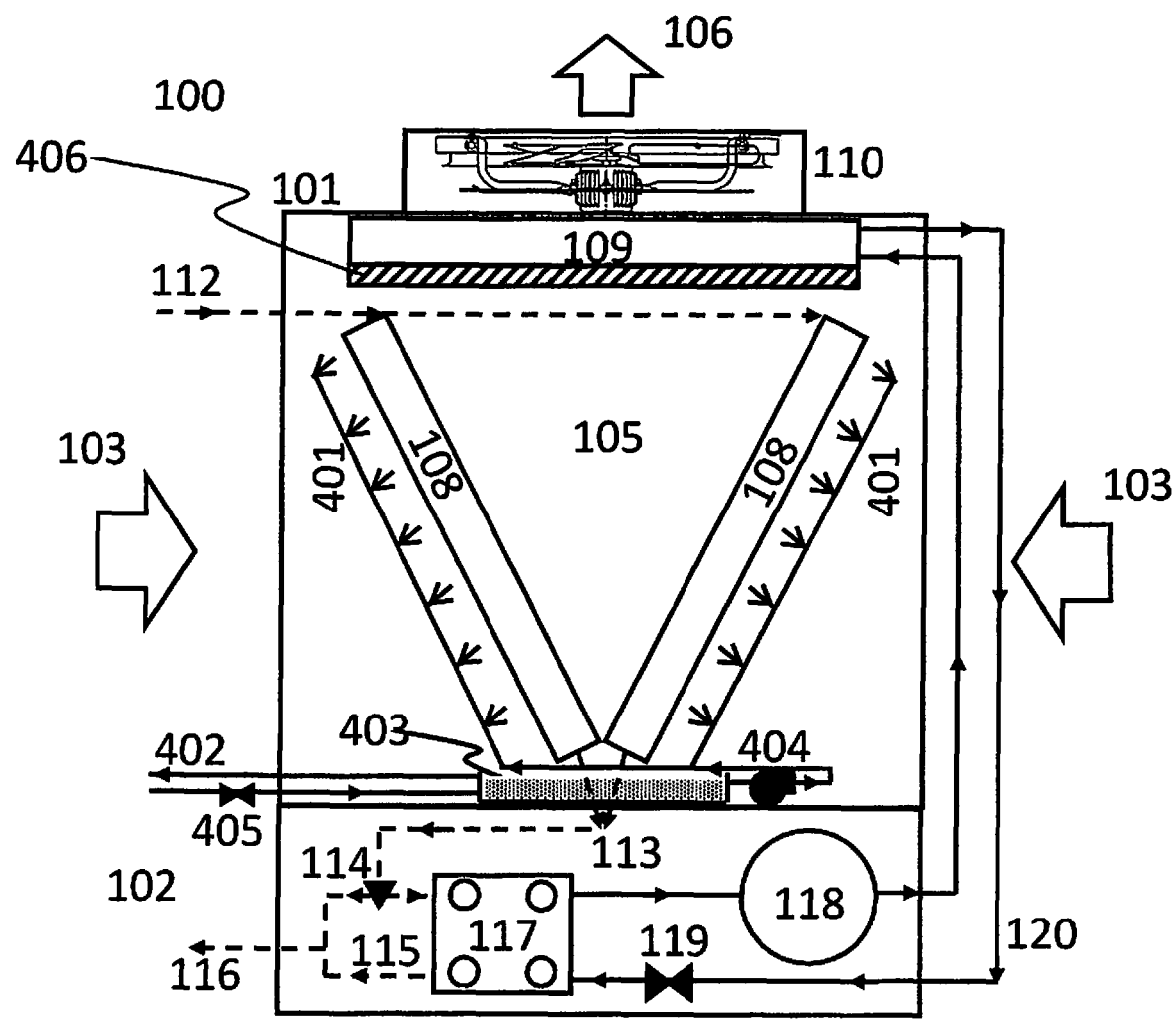
FIG. 4 shows the evaporative fluid-cooler where the evaporative cooling media in FIG. 1 is replaced with a low or high-pressure water spray system.

FIG. 4 shows the evaporative fluid-cooler 100 where the evaporative cooling pads 107 in FIG. 1 are replaced with low or high-pressure water spray systems 401. The outdoor air 103 process inside the fluid-cooler 100 and the cooling process for the hot process fluid 112 are the same as FIG. 1. Using the water spray system 401 results in less air pressure drop on the air side of the fluid cooler 100 and less power consumption for the exhaust fans 110 to move the air inside the fluid-cooler 100. For this purpose, tap water or pure water 402, which depends on using low pressure or high-pressure spray systems and the quality of the tap water, enters a fluid tank 403. The fluid tank 403 can be a closed or open tank.

A water pump 404 pumps the water 402 from the tank 403 to the water spray systems 401 where the water 402 is sprayed on the main cooling coils 108 and evaporates. The corrosion resistant coating may be used on the main cooling coils 108 to protect them from corrosion and expand the life of them s. A hydrophilic coating may also be used on the main cooling coils 108 to improve the efficiency of the fluid-cooler 100 when the water spray system 401 is in operation. Overall, using water spray systems 401 instead of the evaporative cooling pads 107 can improve the efficiency of the system in warm weather operating conditions and result in minimizing the operation of the mechanical cooling system and compressors 118 in warm weather conditions. The water, which may drip for the main cooling coils 108, collects in the water tank 403. Different strategies can be used to control the water quality in the water tank 403 including but not limited to regular drain of the water from the tank using a drain valve 405.

Also, a mist-eliminator 406 can be used before the condenser coils 109 to separate the water droplets from the air 105 before entering the condenser coils 109 which results in protecting the condenser coils 109 from possible corrosion and saving water.

Figure 5:
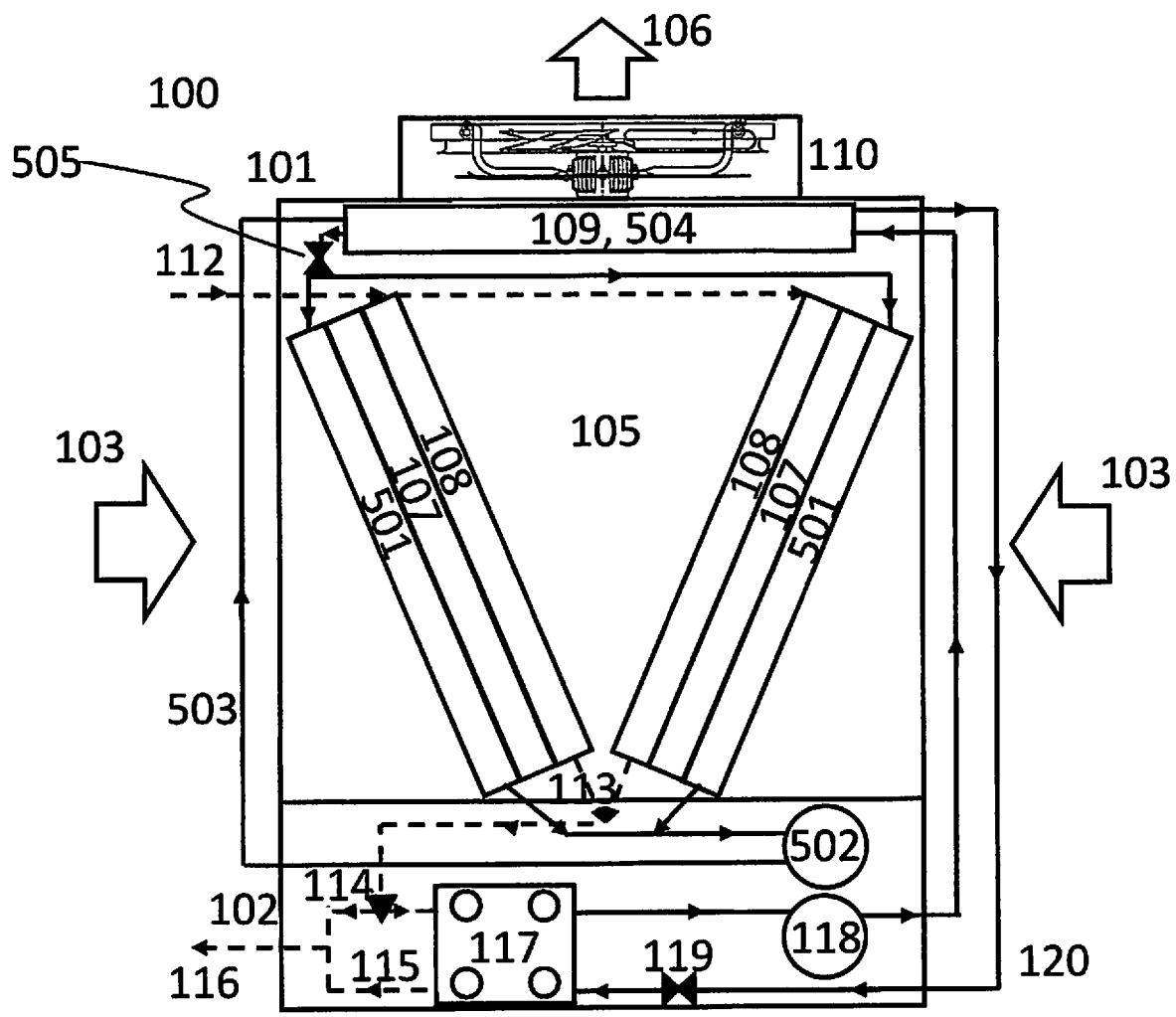
FIGS. 5 and 6 show the evaporative fluid-cooler, which utilizes a pre-cooling system to improve the efficiency of the evaporative fluid-cooler under extreme hot weather operating conditions.
Figure 6:
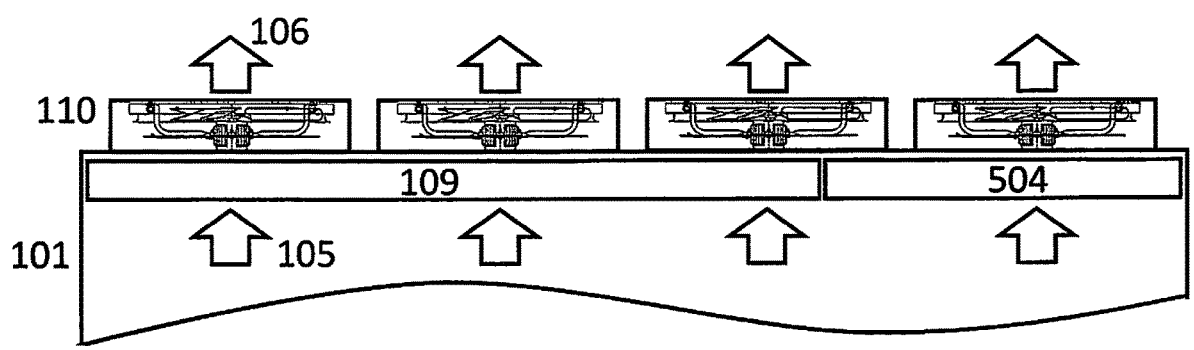

FIGS. 5 and 6 show the evaporative fluid-cooler 100, which is utilizing an air pre-cooling system for the outdoor air inlet 103 to improve the efficiency of the fluid-cooler 100 under extreme hot weather operating conditions. The pre-cooling system can be a separate dedicated mechanical cooling system. During warm weather condition when the outdoor air 103 temperature increases and using the evaporative cooling pads 107 before the main cooling coils 108 is not enough to cover 100% of the required cooling load, a pre-cooling mechanical system and compressors 502 kick in before the main mechanical cooling system and compressors 118 start to operate. In the pre-cooling case, the outdoor air 103 is sensibly cooled using cooling coils 501 which are installed before the evaporative cooling pads 107. The air downstream of the cooling coils 501 has lower wet bulb temperature compared to the outdoor air 103 which improves the evaporative cooling performance for the evaporative cooling pads 107. The air downstream of the evaporative cooling pads 107 can reach dry bulb temperature which is potentially lower than the outdoor air 103 wet bulb temperature. This is not possible without using the pre-cooling system. The mechanical pre-cooling system uses a refrigerant 503 which can be the same or different than the refrigerant 120. The refrigerant 503 picks up the heat from the outdoor air 103 in the cooling coils 501 and evaporates. The vapor refrigerant 503 enters the compressors 502 and becomes high pressure vapor refrigerant.

The high-pressure refrigerant 503 enters pre-cooling condenser coils 504 for the mechanical pre-cooling system which are located at the same place as the main condenser coils 109. FIG. 6 shows how the main condenser coils 109 and the pre-cooling condensers 504 are placed before the exhaust fans 110. The refrigerant 503 becomes cold in the pre-cooling condenser coils 504 and turns into high pressure liquid. Then, the high-pressure liquid refrigerant 503 runs into an expansion valve 505 before entering the cooling coils 501. The expansion valve 505 reduces the pressure of the liquid refrigerant 503 before entering the cooling coils 501. If the cold process fluid 116 still has higher temperature than the process fluid's target supply temperature even with using the mechanical pre-cooling system, then the main mechanical cooling system and compressors 118 start operating to reduce the process fluid 116 temperature which passes through the LRHX 117. Those who are expert in the art realize that there might be different configuration to utilize mechanical pre-cooling system in the evaporative fluid-cooler 100.

Figure 7:
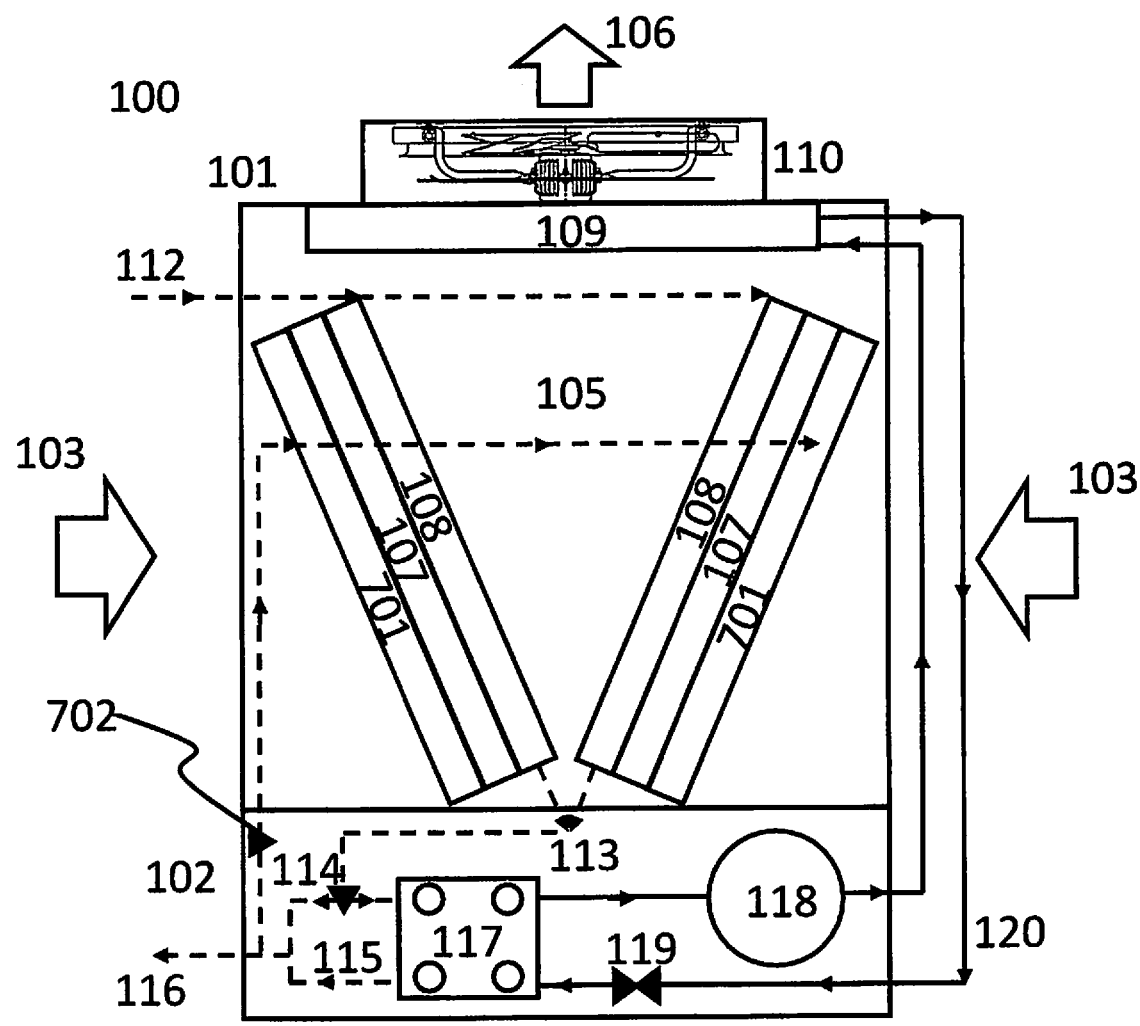
FIG. 7 shows another configuration of the evaporative fluid-cooler which utilizes a second type of pre-cooling system to improve the efficiency of the evaporative fluid-cooler under extreme hot weather operating conditions.

FIG. 7 shows another configuration of the evaporative fluid-cooler 100 which utilizes a pre-cooling system to improve the efficiency of the system under extreme operating conditions. In this configuration, the fluid-cooler 100 utilizes a fluid pre-cooling system using pre-cooling coils 701 before the evaporative cooling pads 107 to sensibly pre-cool the outdoor air 103 before entering the evaporative cooling pads 107. The pre-cooling fluid can be the same as the process fluid 116 and can be water, Glycol, mixture of water and Glycol or any non-conductive fluid. As a result, the air leaving the evaporative cooling pads 107 and entering the main cooling coils 108 potentially can have dry bulb temperature lower than the outdoor air 103 wet bulb temperature. This is not possible without using the pre-cooling system.

The pre-cooling fluid can be the cold supply fluid 116 where part of the cold supply fluid 116 can be directed to the pre-cooling coils 701 using a valve 702. In this case and in warm weather conditions when using the evaporative cooling pads 107 alone cannot cover 100% of the required cooling load, the pre-cooling system kicks in and part of the cold fluid 116 is directed to the pre-cooling coils 701 before running the main mechanical cooling system and compressors 118. The cold fluid 116 enters the pre-cooling coils 701 and sensibly cools the outdoor air 103, which enters the fluid-cooler 100.

In case of using the pre-cooling coils 701 for the pre-cooling purpose, the fluid for the pre-cooling coils 701 can come from any other source including but not limited to a central chiller plant or a cooling tower. The pre-cooling system minimizes the application of the mechanical cooling system in warm weather operating conditions and potentially results in less power consumption. Those who are expert in the art understand that it is possible to use a run-around system for the pre-cooling system. The ratio of a portion of the cold fluid 116 which is directed to the pre-cooling coils 701 to the overall cold fluid 116 that is available in fluid-cooler 100 depends on the design of the fluid-cooler 100 and can vary. In extreme hot weather conditions when even by using the pre-cooling coils 701 the cold process fluid 116 temperature is above the process fluid's target supply temperature, the mechanical cooling system and compressors 118 kick in to provide further cooling to the process fluid 116.

Figure 8:
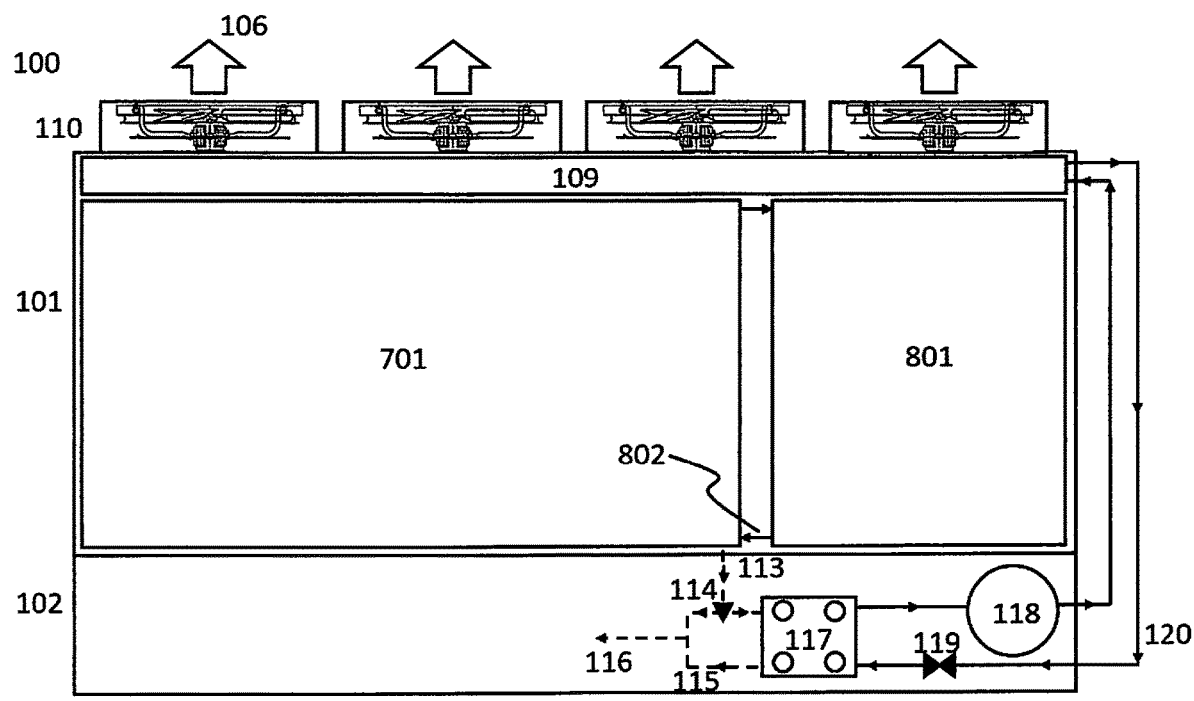
FIG. 8 shows the application of a run-around pre-cooling system for the proposed evaporative fluid-cooler where heat rejection coils for the run-around pre-cooling system are placed along main cooling coils and at the same location.

FIG. 8 shows the application of the run-around pre-cooling system for the fluid-cooler 100 where heat rejection coils 801 for the pre-cooling system are placed along the main cooling coils 108 and at the same location. In this configuration, and in warm weather conditions when using the evaporative cooling pads 107 alone cannot cover 100% of the required cooling load and deliver supply fluid 116 at the process fluid's target supply temperature, the pre-cooling system kicks in. The pre-cooling coils 701 are placed before the evaporative pads 107 and the pre-cooling fluid 802 sensibly cools the outdoor air 103 which is passing through the pre-cooling coils 701. The pre-cooling fluid 802 can be water, Glycol mixture of water and Glycol or any other fluid compatible with coils' 701 and 801 materials. The pre-cooling fluid 802 picks up the heat from the outdoor air 103 and leaves the pre-cooling coils 701. Then the hot pre-cooling fluid 802 enters the heat rejection coils 801, which are dedicated to the pre-cooling system, and becomes cold. The heat rejection coils 801 are in the same location as main cooling coils 108 and there are the evaporative cooling pads 107 placed before them (not shown in FIG. 8).

In the heat rejection cycle of the pre-cooling system in FIG. 8, first, the outdoor air 103 passes through the evaporative cooling pads 107 which are placed before the heat rejection coils 801. The outdoor air becomes cool close to its wet bulb temperature during evaporation process within the evaporative cooling pads 107. Then, the cool air passes over the heat rejection coils 801 and cools the hot pre-cooling fluid 802 which passes through the heat rejection coils 801. The exhaust fans 110 draw the air through both the main cooling coils 108 and the heat rejection coils 801.

The advantage of using the run-around system for the pre-cooling process is to dedicate the process fluid 116 only for the main cooling purpose and has precise control on the process fluid 116. Also, it minimizes the risk of unit failure due to failure or leakage in the pre-cooling system, since the pre-cooling fluid 802 is completely separate from the process fluid 116. Again, in extreme hot weather conditions when even by using the pre-cooling system the process fluid 116 temperature is above the process fluid's target supply temperature, the mechanical cooling system and compressors 118 kick in to provide further cooling to the process fluid 116. The area along the length of the fluid-cooler 100 which is occupied by the main cooling coils 108 over the area occupied by the heat rejection coils 801 varies and depends on the design of the fluid cooler 100.

The proposed fluid coolers with the pre-cooling system in FIGS. 5 to 8 offer further efficiency to the proposed fluid cooler in FIGS. 1 to 4 in a single apparatus by applying pre-cooling techniques to the proposed fluid-cooler in FIGS. 1 to 4. Adding pre-cooling equipment 501 and 701 before the evaporative media 107 minimizes the application of the mechanical cooling system and the wet-economizer with assisted DX mode in many locations, which reduces the overall power and water consumptions of the fluid cooler. The pre-cooling system in the proposed layout in FIGS. 5 to 8 for the novel fluid-cooler in FIGS. 1 to 4 is presented for the first time herein.

Figure 9:
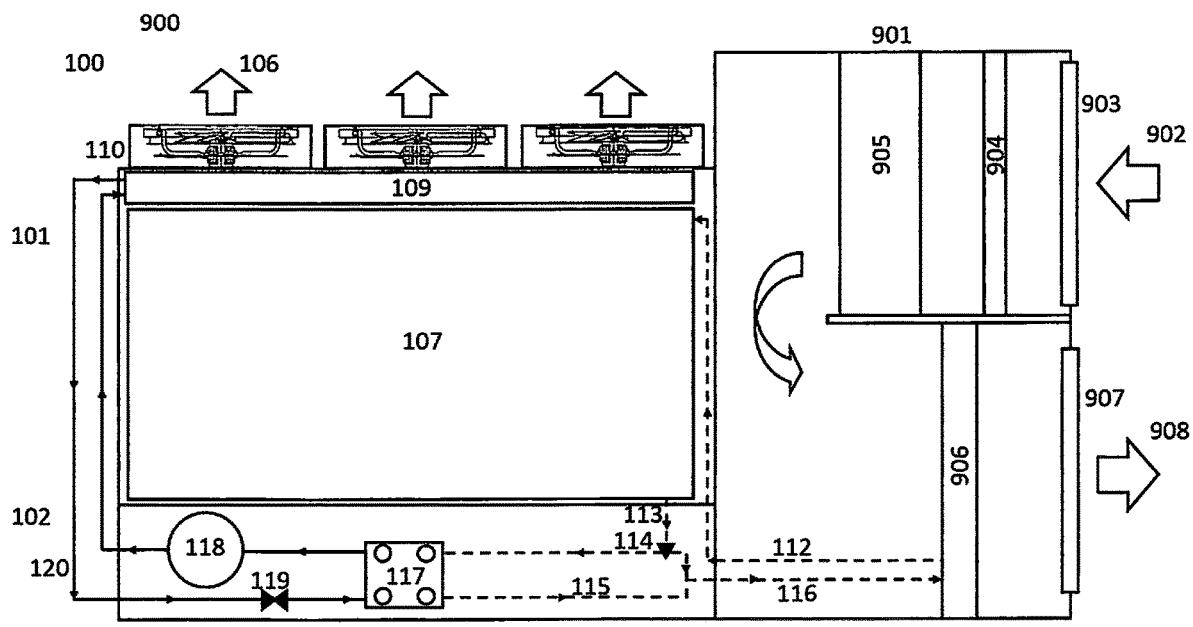
FIG. 9 shows the application of the proposed evaporative fluid-cooler to develop a packaged indirect air cooling unit.

FIG. 9 shows the application of the evaporative fluid-cooler 100 to develop a packaged indirect air cooling unit 900. Packaged indirect air cooling unit 900 usually is an outdoor unit with possibility of installing it inside an enclosed space. The packaged indirect air cooling unit 900 is directly comparable with indirect evaporative cooling units that are available in the market. In this configuration, the evaporative fluid-cooler 100 is attached to an air handling unit 901 to develop the packaged indirect air cooling unit 900. The operation of the evaporative fluid-cooler 100 can be the same as any of the configurations presented in FIGS. 1 to 8. In the air handling unit 901, the hot aisle return air 902 from the enclosed space enters the unit 901 through an air inlet damper and opening 903. The hot aisle return air 902 passes through a filter rack 904 which can be placed in any location between the air inlet opening 903 and air outlet opening 907. Supply fans 905 pull the hot aisle return air 902 from the enclosed space and are responsible for the air movement inside the air handling unit 901. The supply fans 905 can be installed in either draw through or blow through configurations respect to cooling coils 906. The hot air 902 passes through the cooling coils 906 and the result is the supply air 908 which is cold and its temperature is based on the required cold supply temperature for the enclosed space.

The cooling coils 906 sensibly cool the hot air 902. The cold process fluid 116 flows through the cooling coils 906 and picks up the heat from the hot air 902. The hot process fluid 112 leaves the cooling coils 906 and flows to the fluid-cooler 100 for cooling process. The process fluids 112 and 116 flow in a 100% sealed loop and always recirculate between the evaporative fluid-cooler 100 and the air handling unit 901. Also, the packaged indirect air cooling unit 900 provides 100% air recirculation system for the enclosed space which minimizes the dependency of the enclosed space to the outdoor air as a source of cooling, and minimizes the filtration requirement for the enclosed space. The packaged indirect air cooling unit 900 offers a single mode of operation for the hot air 902 which is sensible cooling using the cooling coil 906. Those are expert in the art understand that the bottom section 102 can be moved into the air handling unit 901 to maximize the heat transfer area in fluid-cooler 100 for the main cooling coils 108 and make the packaged indirect air cooling unit 900 more efficient and compact.

Advantages Over the Prior Art

1. One packaged solution offering the advantages of the economizer and mechanical cooling systems to provide the process fluid to the end user which saves in number of equipment installed on site, installation, space and maintenance requirements.
2. Premium power and water consumptions since the proposed fluid cooler offers 3 modes of operation to optimize power and water consumptions.
3. Global solution which can be used in any location worldwide. This unit offers a certain and defined cooling capacity at a given size in any locations versus evaporative fluid-coolers with no mechanical cooling which their cooling capacity depends on the installation location and operating conditions. Customers can use this unit to do a global data center design with given unit capacity and footprint.
4. The process fluid includes but not limited to water, glycol, mixture of water and Glycol, non-conductive fluids or a refrigerant.
5. The proposed fluid cooler requires no chemical water treatment since this unit does not hold any water within or uses a regular drain strategy in case of using the direct evaporative cooler (DEC) with the pumping system and collection pan which expands the application of this new design tremendously. Using water treatment is one of the weaknesses for most of evaporative cooling systems in general.
6. The proposed fluid cooler has applications in either air-cooling, liquid cooling or a combination of both (called the hybrid cooling).
7. The proposed fluid cooler is a standard product with modularity in size/cooling capacity to offer different cooling unit sizes for different markets (e.g. 200 kW, 400 kW and 1 MW units).
8. The proposed fluid cooler can offer very low water consumption by optimizing the main cooling coils' size and performance to expand the operation the fluid cooler under the dry economizer mode.
9. The proposed fluid cooler has optimum power consumption by modulating the fans, using high efficiency mechanical cooling systems, and maximizing economizer hours to avoid using mechanical cooling.
10. Isolating the process fluid circuit from the working fluid used in the evaporation system protects the process fluid from any contaminations and eventually protects the end user.
11. This unit offers a self-cleaning feature for the air side by reversing the EA fans turning direction and blowing dirt and derbies from the evaporative media and the main cooling coils.
12. The proposed fluid cooler can offer 100% redundancy to the end user by sizing the mechanical cooling system to support 100% of the required cooling capacity.

Unit Control and Optimization

Switch between different operating modes:

1. The proposed fluid cooler can have an outdoor air temperature & humidity (T&H) sensor installed which measures outdoor air conditions.
2. The fluid cooler's dry-bulb temperature limit can be calculated based on the unit specification including but not limited to the main cooling coils' sensible performance and unit operating conditions.
3. When the outdoor air (OA) dry-bulb (DB) temperature<dry build limit (DBL), the unit operates under the dry economizer mode. Also, to achieve optimum power efficiency, the exhaust fans are modulating.
4. When the OADB temperature=DBL, the unit operates under the dry economizer mode and the exhaust fans are at 100% of their speed.
5. When the OADB temperature> DBL, the unit first enters the wet-economizer mode. The OA wet-bulb (WB) limit of the unit can be calculated based on the main cooling coils' efficiency, the evaporative system's efficiency and the operating conditions. When the OADB> DBL and the OAWB<wet bulb limit (WBL) of the unit, then the unit enters the wet-economizer mode. In this mode, the evaporative cooling system and the evaporative pads start to operate and the exhaust fans again start to modulate to optimize the power consumption.
6. When the OAWB> WBL and the exhaust fans are at 100% of their speed, then the unit enters the wet-economizer with assisted DX mode where the exhaust fans continue operating at 100% of their speed and the mechanical cooling system and compressors start to operate to reject the remaining of the heat from the process fluid. The hot return process fluid first passes through the main cooling coils where part of the heat is rejected from the hot process fluid to the air (first stage of cooling). Then the process fluid passes through the LRHX where the refrigerant picks up the rest of the heat from the process fluid, and the cold process fluid is supplied to the end user at the target supply temperature (second stage of cooling). The unit continues to operate under this mode as long as the OAWB>WBL.

7. To optimize the power and water consumptions of the proposed fluid-cooler, it is possible to manipulate the DBL and WBL of the unit. For example:
   a) To optimize power consumption, it is possible to switch to wet-economizer mode at OADB<DBL which may result in lower power consumption but slightly higher water consumption.
   b) To optimize water consumption, it is possible to start the mechanical cooling system earlier than OAWB<WBL. This may result in lower water consumption but slightly higher power consumption.

This embodiment has a self-cleaning feature for the air side by reversing the EA fans turning direction and blowing dirt and derbies from the evaporative media and the main cooling coils.

What is claimed is:

1. An apparatus with an integrated mechanical cooling system for cooling an enclosed space and rejecting heat from a process fluid the apparatus comprising:
   a. a first section where ambient outdoor air enters the apparatus and rejects the heat from the process fluid that returns from the enclosed space, wherein the process fluid may comprise the following:
      i. water, Glycol, mixture of water and Glycol, refrigeration fluid, or any non-conductive fluid returning from the enclosed space or a second apparatus inside or outside of the enclosed space;
   b. ambient outdoor air openings on both sides of the apparatus along a length of the apparatus that allows the ambient outdoor air to enter the first section;
   c. a second section comprising:
      i. an evaporative cooling system that uses an evaporative cooling media, or any other equivalent technologies for water evaporation and cooling the entering ambient outdoor air, to pre-cool the entering ambient outdoor air;
      ii. a liquid-to-air heat exchanger (or exchangers) located downstream from the evaporative cooling system that rejects heat from the process fluid to the air;
      iii. at least one condenser coil that is placed downstream from the liquid-to-air heat exchanger(s) to reject the heat from a refrigerant; and
      iv. wherein the refrigerant is a distinct heat exchange medium and is independent from the process fluid;
   d. a third section comprising an air movement means, such as an exhaust air fan(s), that moves air within the apparatus to the ambient outdoor air;
   e. a fourth section that is fluidly connected to the second section comprising an assisted mechanical cooling system, the assisted mechanical cooling system comprising:
      i. an expansion valve that adjusts the pressure of the refrigerant flowing from the condenser coil(s) before entering a liquid-to-refrigerant heat-exchanger (LRHX) to lower pressure of the refrigerant;
      ii. wherein the LRHX transfers heat from the process fluid to the refrigerant;
      iii. at least one compressor that increases the pressure of the refrigerant;
      iv. a three-way valve that directs the process fluid from the liquid-to-air heat exchanger(s) to at least one of the following locations:
         1. The LRHX;
         2. a liquid-to-liquid heat exchanger;
         3. the enclosed space;
         4. an end user; and
         5. a liquid-to-air heat exchanger.

2. The apparatus of claim 1, wherein the apparatus comprises at least three operating modes, comprising:
   a. a first mode wherein:
      i. only sections 1, 2 and 3 are in operation;
      ii. the evaporative cooling system and the assisted mechanical cooling system are not in operation;
      iii. the three-way valve is in operation; and
      iv. the ambient outdoor air cools the process fluid using the liquid-to-air heat exchanger (s);
   b. a second mode wherein:
      i. only sections 1, 2 and 3 are in operation; and
      ii. the three-way valve is in operation;
   c. a third mode wherein sections 1, 2, 3, and 4 are in operation.

3. The apparatus of claim 1, wherein the process fluid leaving the apparatus is fluidly connected to a second apparatus, wherein the second apparatus cools the enclosed space that uses the process fluid to provide cold supply air to the enclosed space.

4. The apparatus of claim 1, wherein the process fluid leaving the apparatus is fluidly connected to a second apparatus, wherein the second apparatus cools the enclosed space and uses the supplied process fluid from the apparatus to provide a cold fluid to the enclosed space and/or the end user directly for this purpose.

5. The apparatus of claim 3, further comprising a third apparatus that cools the enclosed space using the supplied process fluid to provide the cold fluid to the enclosed space and/or the end user.

6. An apparatus with an integrated mechanical cooling system for cooling an enclosed space and rejecting heat from a process fluid, the apparatus comprising:
   a. a first section where ambient outdoor air enters the apparatus and rejects the heat from the process fluid that returns from the enclosed space, wherein the process fluid may comprise the following:
      i. water, Glycol, mixture of water and Glycol, refrigeration fluid, or any non-conductive fluid returning from the enclosed space or a second apparatus inside or outside of the enclosed space;
   b. ambient outdoor air openings on both sides of the apparatus along a length of the apparatus that allows the ambient outdoor air to enter the first section;
   c. a second section comprising:
      i. an evaporative cooling system that uses a water spray system that cools the entering ambient outdoor air;
      ii. a liquid-to-air heat exchanger (or exchangers) located downstream from the water spray system that rejects heat from the process fluid to the air;
      iii. a water collection pan under the liquid-to-air heat exchanger(s) that collects any excess water that drips from the liquid-to-air heat-exchanger(s);
      iv. at least one water pump to direct the water to the water spray system;
      v. water feed and water drain lines and valves that keep the water level in the water collection pan at a desired level;

vi. one or more condenser coils that are located downstream from the liquid-to-air heat exchanger(s) to reject the heat from a refrigerant; and
vii. wherein the refrigerant is a distinct heat exchange medium and is independent from the process fluid;
d. a third section comprising an air movement means, such as an exhaust air fan(s), that moves air from the apparatus to the ambient outdoor air; and
e. a fourth section comprising an assisted mechanical cooling system, comprising:
i. an expansion valve that adjusts the pressure of the refrigerant flowing from the condenser coil(s) before entering a liquid-to-refrigerant heat-exchanger (LRHX) to lower pressure of the refrigerant;
ii. wherein the LRHX transfers heat from the process fluid to the refrigerant;
iii. a compressor (or compressors) that increases the pressure of the refrigerant;
iv. a three-way valve that directs the process fluid from the liquid-to-air heat-exchanger(s) to at least one of the following locations:
1. the LRHX;
2. a liquid-to-liquid heat exchanger;
3. the enclosed space;
4. an end user;
5. a liquid-to-air heat exchanger; and
v. at least one process fluid pump.

7. The apparatus as in claim 1 or 6, wherein:
a. any or all of the equipment in sections 1-4 are re-arranged into other sections.

8. The apparatus as in claim 1 or 6, wherein:
a. any or all of the sections are attached together to form a single body unit.

9. The apparatus as in claim 1 or 6, wherein:
a. any of the sections are installed apart from each other.

10. The apparatus as in claim 1 or 6, wherein:
a. any of the sections are combined in one section.

11. The apparatus as in claim 1 or 6, further comprising:
a. one or more additional liquid-to-air heat exchangers located upstream from the evaporative cooling system.

12. The apparatus of claim 11, further comprising a process air section that cools the return process air from the enclosed space, comprising:
a. at least one return air intake and dampers that direct the return process air from the enclosed space;
b. an air filter;
c. at least one liquid-to-air heat exchanger;
d. a supply air outlet and dampers that direct the cold process air to the enclosed space; and
e. a process air movement system that comprises one or more fans to move the process air inside the process air section and the enclosed space.

13. The apparatus of claim 12, wherein any of the described components are re-arranged into other sections.

14. The apparatus as in claim 1 or 6, further comprising:
a. one or more additional liquid-to-air heat exchangers located upstream from the evaporative cooling system; and
b. a process air section that cools the return process air from the enclosed space, comprising:
i. at least one return air intake and dampers that direct the return process air from the enclosed space;
ii. an air filter;
iii. at least one liquid-to-air heat exchanger;
iv. a supply air outlet and dampers that direct the cold process air to the enclosed space; and
v. a process air movement system that comprises one or more fans to move the process air inside the process air section and the enclosed space.

15. The apparatus of claim 14, wherein any of the described components are re-arranged into other sections.

* * * * *